(12) United States Patent
Nam

(10) Patent No.: US 8,304,776 B2
(45) Date of Patent: Nov. 6, 2012

(54) THIN FILM TRANSISTOR SUBSTRATE AND METHOD FOR FABRICATING THE SAME

(75) Inventor: Seung Hee Nam, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 85 days.

(21) Appl. No.: 12/877,591

(22) Filed: Sep. 8, 2010

(65) Prior Publication Data

US 2011/0095295 A1 Apr. 28, 2011

(30) Foreign Application Priority Data

Oct. 27, 2009 (KR) .......................... 10-2009-0102344

(51) Int. Cl.
*H01L 29/04* (2006.01)
*H01L 29/10* (2006.01)
*H01L 31/00* (2006.01)

(52) U.S. Cl. ............... 257/59; 257/61; 257/69; 257/72; 257/291; 257/347; 257/E21.411; 257/E29.273; 438/30; 438/75; 438/135; 438/144; 438/149; 349/42; 349/43; 349/46; 349/47; 349/139; 349/147

(58) Field of Classification Search .................... 257/59, 257/61, 69, 72, 291, 347, E21.411, E29.273; 439/42, 43, 46, 47, 139, 147; 438/30, 75, 438/135, 144, 149, FOR. 211, FOR. 184

See application file for complete search history.

(56) References Cited

U.S. PATENT DOCUMENTS

| | | | |
|---|---|---|---|
| 6,861,365 B2 | 3/2005 | Taussig et al. |
| 7,059,834 B2 | 6/2006 | Chlus et al. |
| 7,070,406 B2 | 7/2006 | Jeans |
| 7,202,179 B2 | 4/2007 | Taussig et al. |
| 7,291,564 B1 | 11/2007 | Jackson |
| 7,341,893 B2 | 3/2008 | Mei et al. |
| 7,521,313 B2 | 4/2009 | Mei |
| 7,541,227 B2 | 6/2009 | Mei et al. |
| 7,585,424 B2 | 9/2009 | Mei |

*Primary Examiner* — Meiya Li
(74) *Attorney, Agent, or Firm* — McKenna Long & Aldridge LLP

(57) ABSTRACT

The present invention relates to a thin film transistor substrate and method for fabricating the same which can secure an alignment margin and reduce the number of mask steps. A thin transistor substrate according to the present invention includes a gate line and a data line crossing each other to define a pixel, a gate metal pattern under the data line, a thin film transistor having a gate electrode, a source electrode and a drain electrode in the pixel, and a pixel electrode connected to the drain electrode of the thin film transistor by a connection electrode, wherein the data line has a plurality of first slits to disconnect the gate metal pattern from the gate line.

11 Claims, 20 Drawing Sheets

THIN FILM TRANSISTOR SUBSTRATE AND METHOD FOR FABRICATING THE SAME

CROSS REFERENCE TO RELATED APPLICATION

This application claims the benefit of the Patent Korean Application No. 10-2009-0102344, filed on Oct. 27, 2009, which is hereby incorporated by reference for all purposes as if fully set forth herein.

BACKGROUND OF THE DISCLOSURE

1. Field of the Disclosure

The present invention relates to a thin film transistor substrate and method for fabricating the same that secures an alignment margin and reduces the number of mask steps.

2. Discussion of the Related Art

Liquid crystal display (LCD) devices, one of flat panel display devices for displaying images by using liquid crystal, are widely used throughout the industry in general owing to various advantages such as thin profile, lightweight, a low driving voltage and low power consumption compared to other display devices.

LCD devices are provided with a liquid crystal panel having a matrix of liquid crystal cells and a driving circuit for driving the liquid crystal panel. The liquid crystal panel has a thin film transistor substrate and a color filter substrate arranged opposite to each other with liquid crystal disposed therebetween. Formed on an upper substrate, the color filter substrate has a black matrix for preventing light from leaking, a color filter for producing a color, a common electrode for forming an electric field with a pixel electrode, and an upper alignment film formed over the above elements for the alignment of the liquid crystal.

The thin film transistor substrate has gate lines and data lines formed on a lower substrate, a thin film transistor formed at every crossing portion of the gate lines and the data lines as a switching device, a pixel electrode formed for each liquid crystal cell and connected to the thin film transistor, and an alignment film coated over the above elements. The thin film transistor supplies a pixel signal from the data line to the pixel electrode in response to a scan signal supplied to the gate line.

The thin film transistor substrate of the liquid crystal panel requires a plurality of mask steps, which makes the fabrication process complicate and thus increases the production costs. That is, because each mask step includes a thin film deposition step, a washing step, a photolithography step, an etching step, a photoresist peeling off step, an inspection step and so on, the production costs increase. Of these steps, the photolithography step requires an expensive equipment due to a high alignment accuracy requirement. When a misalignment occurs during the photolithography step, the misalignment directly causes a defect. In particular, because the gate lines, the data lines and the pixel electrodes are formed by different mask steps, a probability of misalignment is very high during the photolithography process.

Consequently, efforts are being made to reduce the number of mask steps required for fabricating a thin film transistor substrate and thus reduce the production costs.

SUMMARY OF THE DISCLOSURE

Accordingly, the present invention is directed to a thin film transistor substrate and method for fabricating the same that substantially obviate one or more of the problems due to limitations and disadvantages of the related art.

An advantage of the present invention is to provide a thin film transistor substrate and method for fabricating the same that secures an alignment margin and reduces the number of mask steps.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a thin transistor substrate may, for example, include a gate line and a data line crossing each other to define a pixel, a gate metal pattern under the data line, a thin film transistor having a gate electrode, a source electrode and a drain electrode in the pixel, and a pixel electrode connected to the drain electrode of the thin film transistor by a connection electrode, wherein the data line has a plurality of first slits to disconnect the gate metal pattern from the gate line.

In another aspect of the present invention, a method for fabricating a thin film transistor substrate may, for example, include forming a first conductive pattern group including a gate line, a gate metal pattern and a gate electrode of a thin film transistor; a gate insulating pattern; a semiconductor pattern; a second conductive pattern group including a data line, a source electrode and a drain electrode of the thin film transistor; a pixel electrode; and a plurality of first slits to disconnect the gate metal pattern from the gate line on a substrate by a first patterning process, and forming a connection electrode connecting the drain electrode to the pixel electrode by a second patterning process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF SPECIFIC EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
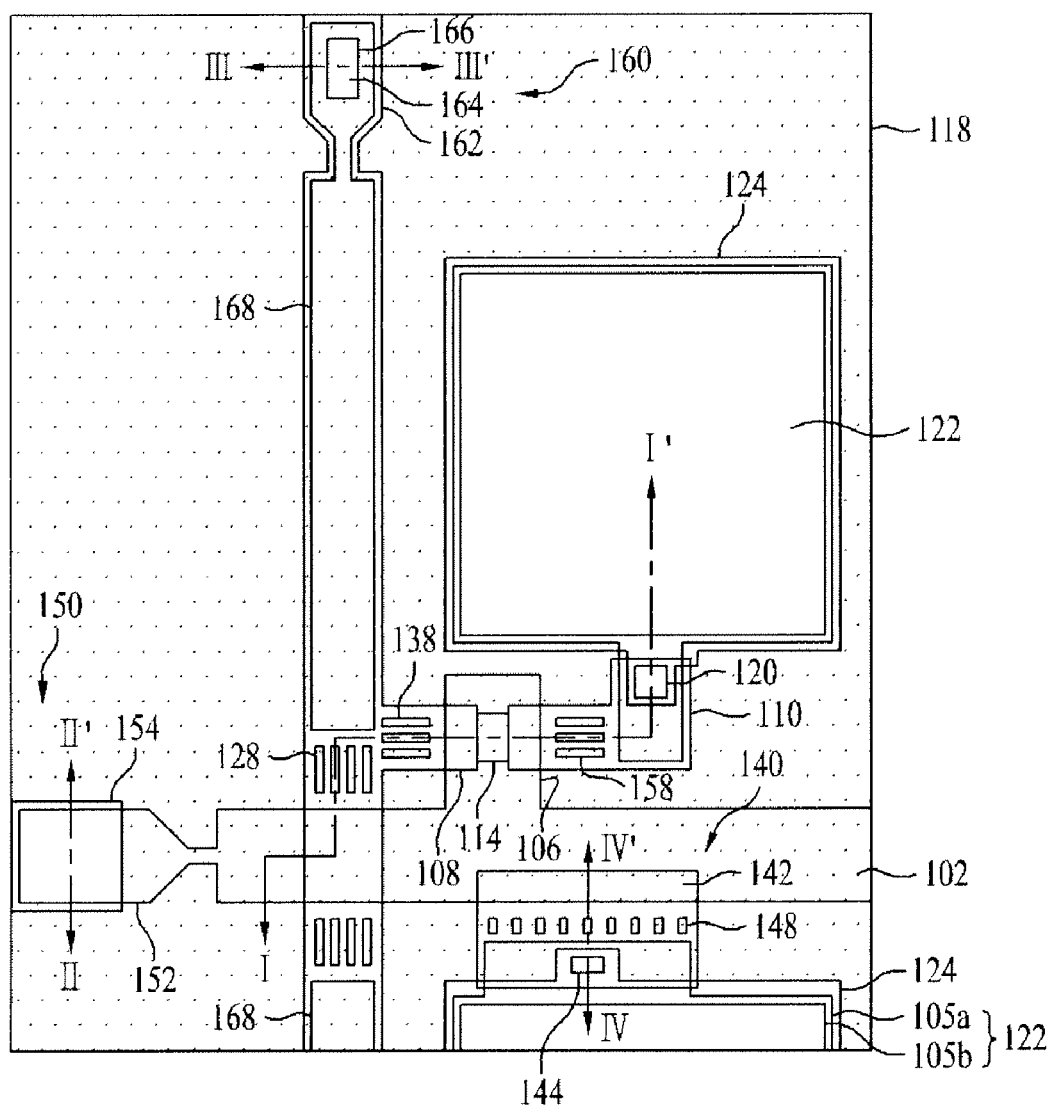
FIG. 1 shows a plan view illustrating a thin film transistor substrate in accordance with a first embodiment of the present invention.
Figure 2:
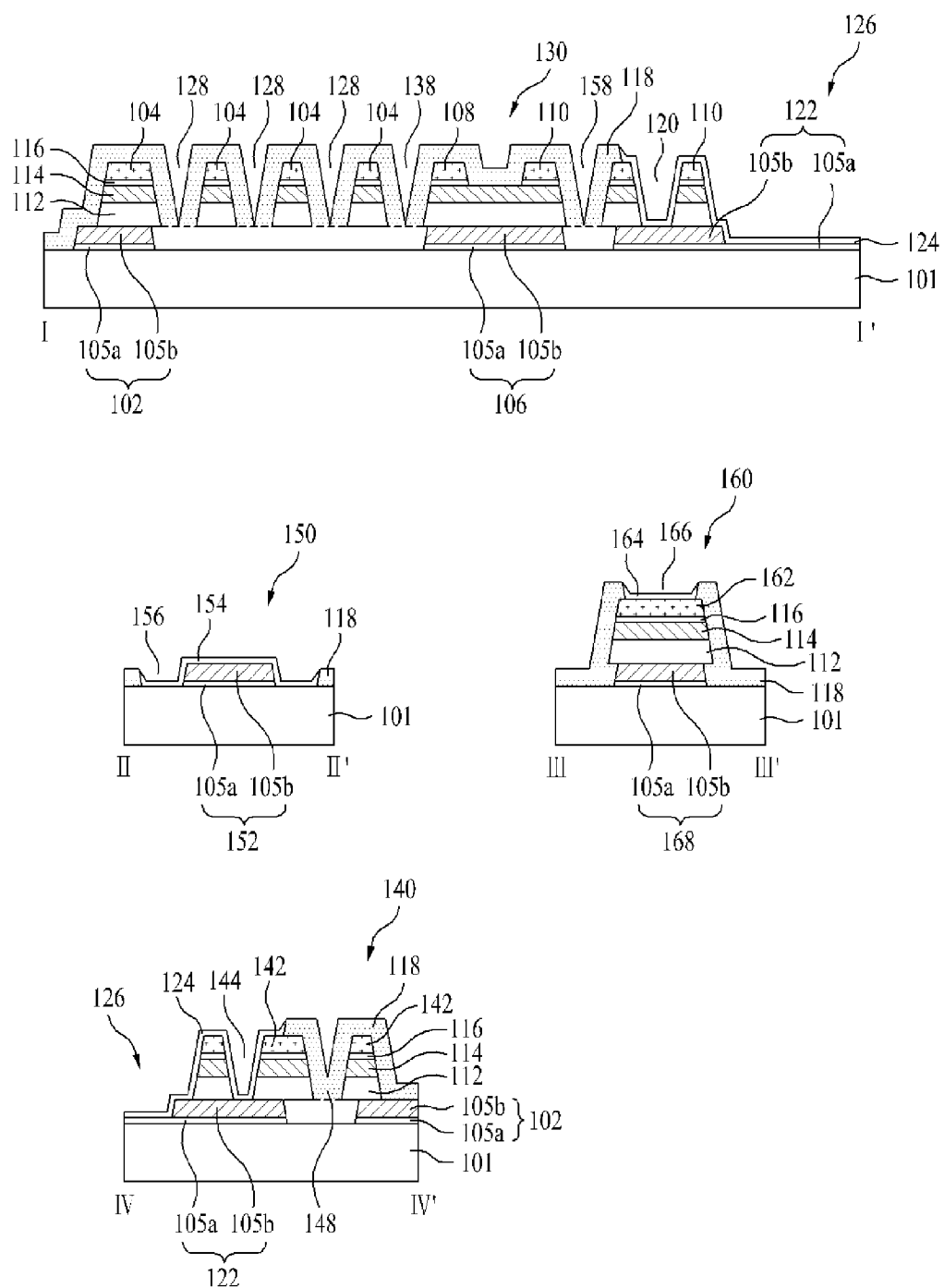
FIG. 2 shows sectional views of the thin film transistor substrate cut across lines I-I', II-II', III-III', and IV-IV' in FIG. 1, respectively.

FIGS. 1 and 2 show a plan view and a sectional view illustrating a thin film transistor substrate in accordance with a first embodiment of the present invention, respectively.

Referring to FIGS. 1 and 2, the thin film transistor substrate includes gate lines 102 and data lines 104 formed to cross each other on a lower substrate 101 with a gate insulating pattern 112 disposed therebetween, a thin film transistor 130 adjacent to every crossing portion, a pixel electrode 122 formed at every pixel region defined by the crossing portions, and a storage capacitor 140 connected to the pixel electrode 122. The thin film transistor substrate further includes a gate pad 150 connected to the gate line 102 and a data pad 160 connected to the data line 104.

The thin film transistor 130 provides a pixel signal supplied from the data line 104 to the pixel electrode 122. To do this, the thin film transistor 130 includes a gate electrode 106 connected to the gate line 102, a source electrode 108 connected to the data line 104, a drain electrode 110 opposite the source electrode 108 connected to the pixel electrode 122, an active layer 114 overlapped with the gate electrode 106 with the gate insulating pattern 112 disposed therebetween to form a channel between the source electrode 108 and the drain electrode 110, and an ohmic contact layer 116 formed on the active layer 114 except the channel portion to form an ohmic contact with the source electrode 108 and the drain electrode 110. The active layer 114 and the ohmic contact layer 116 are also overlapped with a storage electrode 142, the data line 104 and a data pad lower electrode 162.

The pixel electrode 122 is formed at the pixel region defined by the crossing of the gate line 102 and the data line 104. The pixel electrode 122 has a transparent conductive layer 105a formed on the lower substrate 101 and a gate metal layer 105b formed on an edge of the transparent conductive layer 105a. The gate metal layer 105b of the pixel electrode 122 is connected to a portion of the data electrode 110 exposed by a drain contact hole 120 through a connection electrode 124, and is also connected to a portion of the storage electrode 142 exposed by a storage contact hole 144 through the connection electrode 124. Accordingly, the pixel electrode 122 receives the pixel signal supplied from the thin film transistor 130 to form a voltage difference with a common electrode formed on a color filter substrate opposite the thin film transistor substrate. The voltage difference makes the liquid crystal between the thin film transistor substrate and the color filter substrate rotate due to its dielectric anisotropy and control an amount of light that transmits from a light source (not shown) toward the color filter substrate via the pixel electrode 122.

Figure 3:
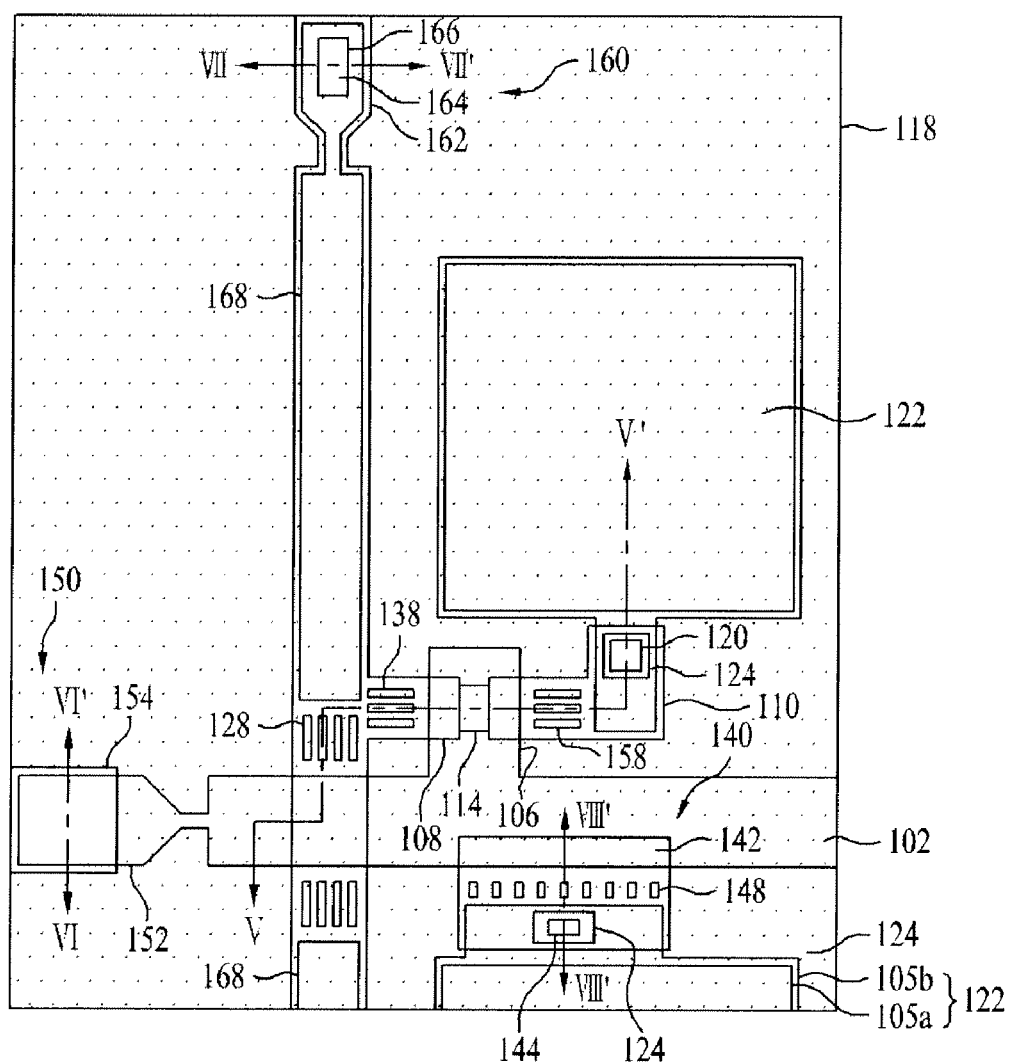
FIG. 3 shows a plan view illustrating a thin film transistor substrate in accordance with a second embodiment of the present invention.
Figure 4:
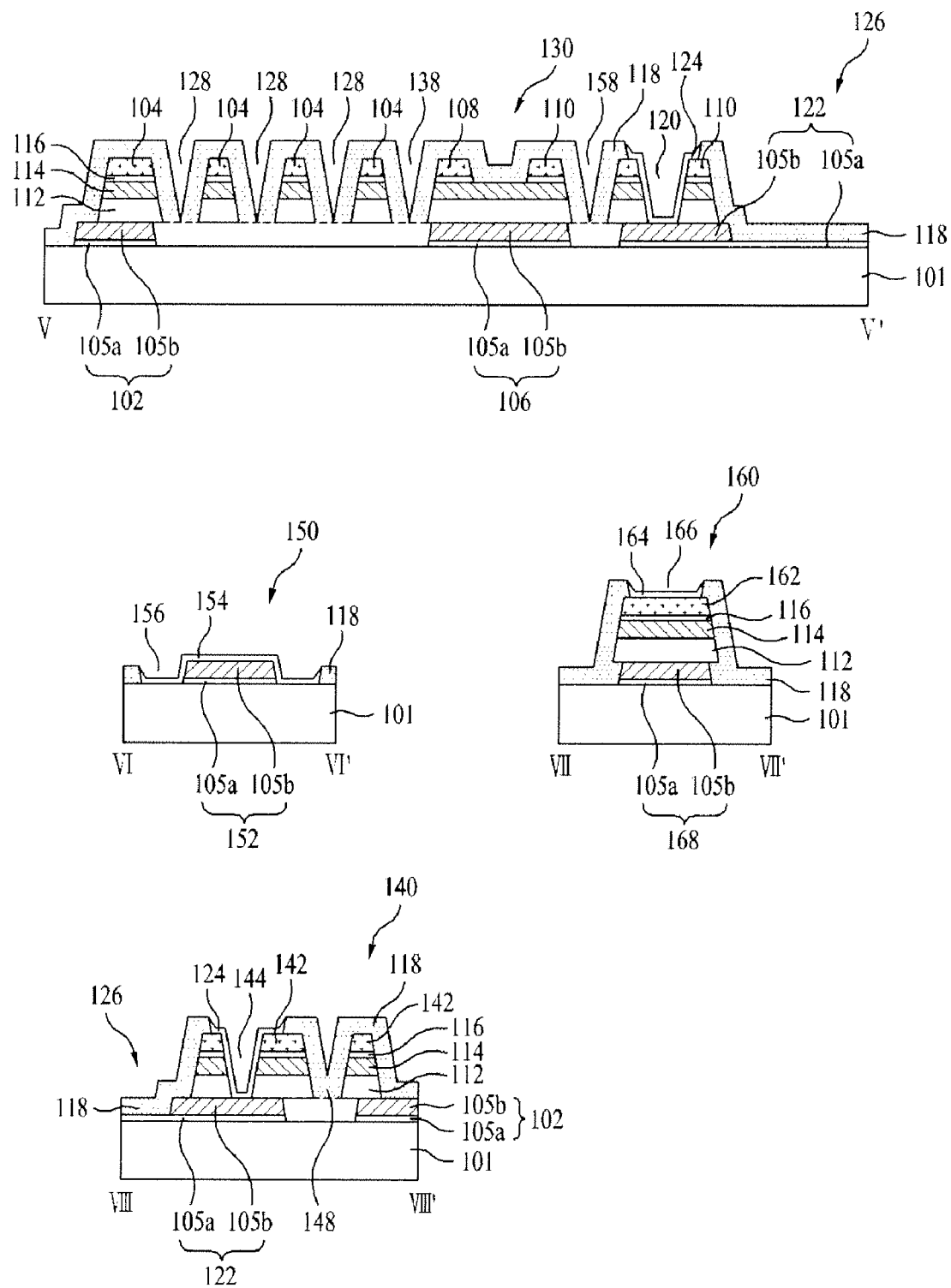
FIG. 4 shows sectional views of the thin film transistor substrate cut across lines V-V', IV-IV', VII-VII', and VIII-VIII' in FIG. 3, respectively.

Still referring to FIGS. 1 and 2, the connection electrode 124 is formed to have a boundary with a protective film 118 at regions near a pixel hole 126, the drain contact hole 120 and the storage contact hole 144. Alternatively, referring to FIGS. 3 and 4, the connection electrode 124 is formed to have a boundary with the protective film 118 at regions near the drain contact hole 120 and the storage contact hole 144. Because the connection electrode 124 in FIGS. 1 and 2 is positioned at the pixel region exposed through the pixel hole 126, it is formed of a transparent conductive layer connected to the pixel electrode 122. Meanwhile, because the connection electrode 124 in FIGS. 3 and 4 is overlapped with the gate metal layer 105b of the pixel electrode 122, it can be formed with a single or multiple layers of at least either one of an opaque conductive layer and a transparent conductive layer. The transparent conductive layer of the connection electrode 124 may be formed of indium tin oxide ITO, indium tin zinc oxide ITZO, tin oxide TO, indium zinc oxide IZO, or $SnO_2$, and the opaque conductive layer of the connection electrode 124 may be formed of molybdenum Mo, titanium Ti, tantalum Ta, or aluminum Al.

The storage capacitor 140 is overlapped with a prior stage gate line 102 and the storage electrode 142, with the gate insulating pattern 112 disposed therebetween. The storage electrode 142 is connected to the gate metal layer 105b of the pixel electrode 122 exposed by the storage contact hole 144 through the connection electrode 124. The storage capacitor 140 allows the pixel signal received at the pixel electrode 122 to be sustained securely until the next pixel signal is charged.

The gate line 102 is connected to a gate driver (not shown) through the gate pad 150. The gate pad 150 has a gate pad lower electrode 152, which is an extension from the gate line 102, and a gate pad upper electrode 154 connected to a top side of the gate pad lower electrode 152. The gate pad upper electrode 154 is connected to the gate pad lower electrode 152 through a gate contact hole 156 that passes through the protective film 118. The gate pad upper electrode 154 forms a boundary with the protective film 118 near the gate contact hole 156.

The data line 104 is connected to a data driver (not shown) through the data pad 160. The data pad 160 has a data pad lower electrode 162, which is an extension from the data line 104, and a data pad upper electrode 164 connected to the data pad lower electrode 162. The data pad upper electrode 164 is connected to the data pad lower electrode 162 through a data contact hole 166 that passes through the protective film 118. As shown in FIGS. 2 and 4, between the data pad lower electrode 162 and the lower substrate 101 are the double-layered gate metal pattern 168, the gate insulating pattern 112, the active layer 114 and the ohmic contact layer 116. The data pad upper electrode 164 forms a boundary with the protective film 118 near the data contact hole 166.

In the thin film transistor substrate, the gate line 102, the gate electrode 106, the gate pad lower electrode 152, the gate metal pattern 168 and the pixel electrode 122 have at least a double-layered structure on the substrate with the transparent conductive layer 105a. For example, as shown in FIG. 3, the transparent conductive layer 105a and the opaque gate metal layer 105b form a double-layered structure. The transparent conductive layer 105a may be formed of indium tin oxide ITO, indium tin zinc oxide ITZO, tin oxide TO, indium zinc oxide IZO, or $SnO_2$, and the opaque conductive layer 105b may be formed of copper Cu, chromium Cr, molybdenum Mo, titanium Ti, tantalum Ta, or aluminum Al.

In thin film transistor substrate, the data line 104 has a plurality of first slits 128. The gate metal pattern 168 located under the data line 104 is disconnected near the gate line 102 and the first slits 128 are located in the disconnected portion of the data line 104. Also, the source electrode 108 facing one side of the gate electrode 106 has a plurality of second slits 138. The gate metal pattern 168 located under the data line 104 is disconnected from the gate electrode 106 with the second slits 138 disposed therebetween. The drain electrode 110 facing the other side of the gate electrode 106 has a plurality of third slits 158. The pixel electrode 122 is electrically disconnected from the gate electrode 106 with the third slits 158 disposed therebetween.

A method for fabricating a thin film transistor substrate in accordance with an embodiment of the present invention will be described.

Figure 5:
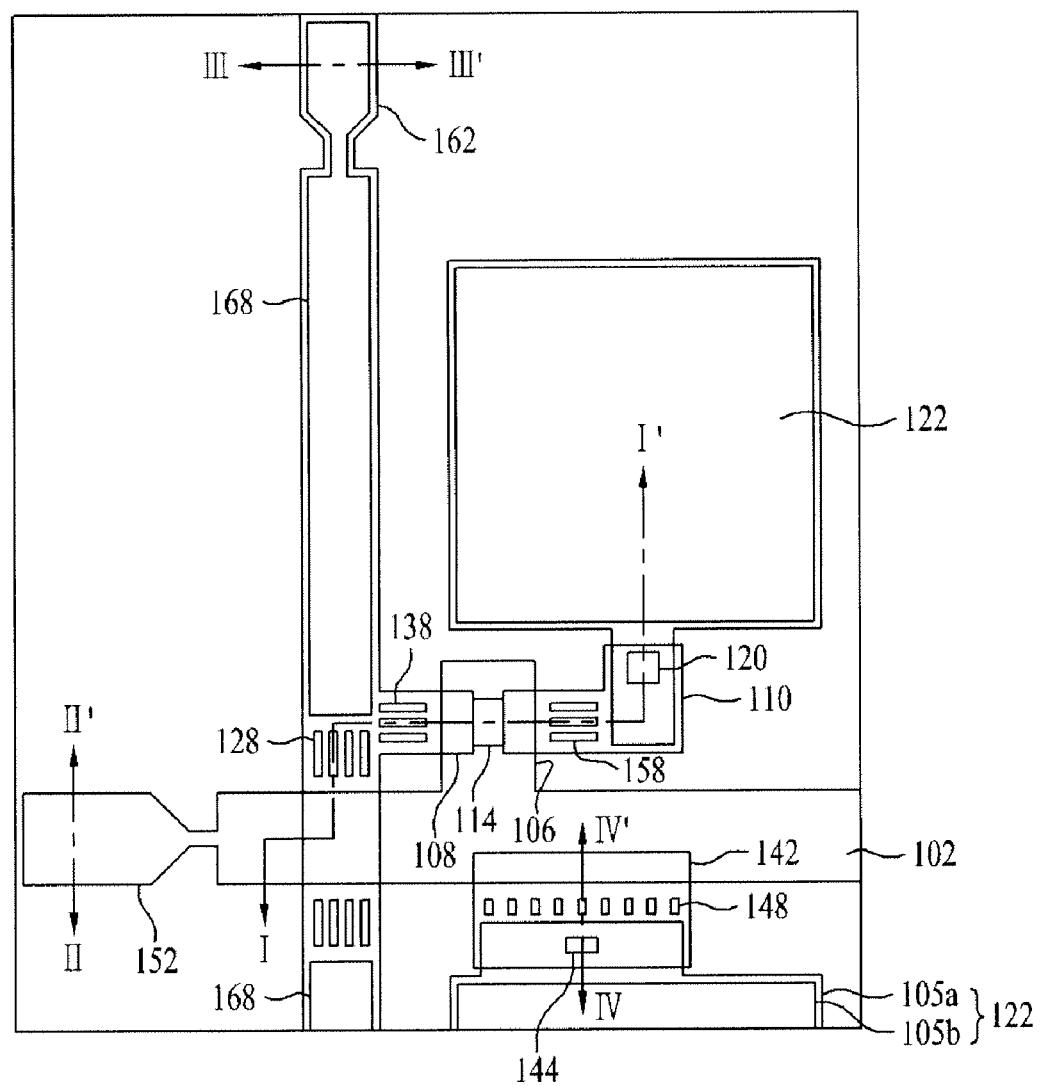
FIG. 5 shows a plan view illustrating a first patterning process for fabricating a thin film transistor substrate of the present invention.
Figure 6:
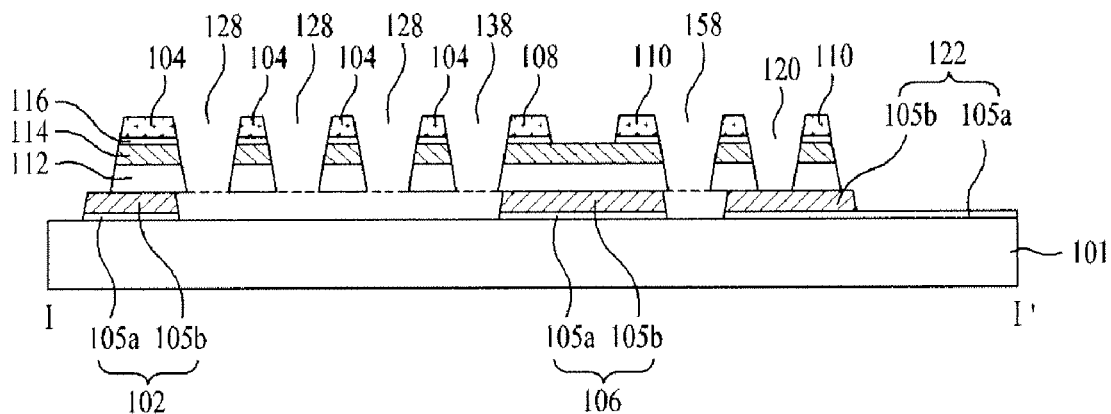
FIG. 6 shows a sectional view illustrating a first patterning process for fabricating a thin film transistor substrate of the present invention.
Figure 6:
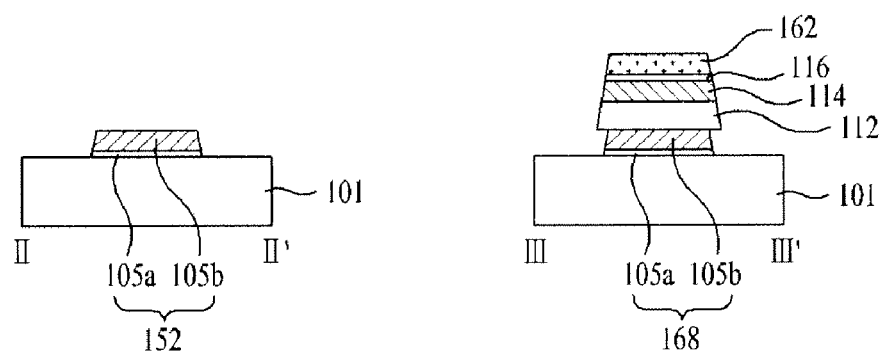
Figure 6:
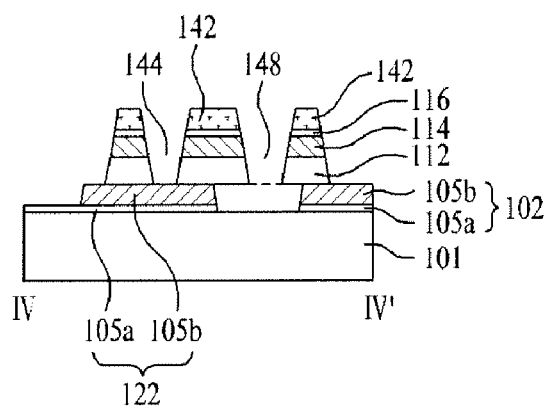

FIGS. 5 and 6 show a plan view and a sectional view illustrating a first patterning process for fabricating a thin film transistor substrate of the present invention.

Referring to FIGS. 5 and 6, a first conductive pattern group including a gate line 102, a gate electrode 106, a gate pad lower electrode 152 and a gate metal pattern 168; a gate insulating pattern 112; a semiconductor pattern including an active layer 114 and an ohmic contact layer 116; a second conductive pattern group including a data line 104, a source electrode 108, a drain electrode 110, a data pad lower electrode 162 and a storage electrode 142; a pixel electrode 122; first to fourth slits 128, 138, 158, 148; a drain contact hole 120 and a storage contact hole 144 are formed on a lower substrate 101.

Figure 7A:
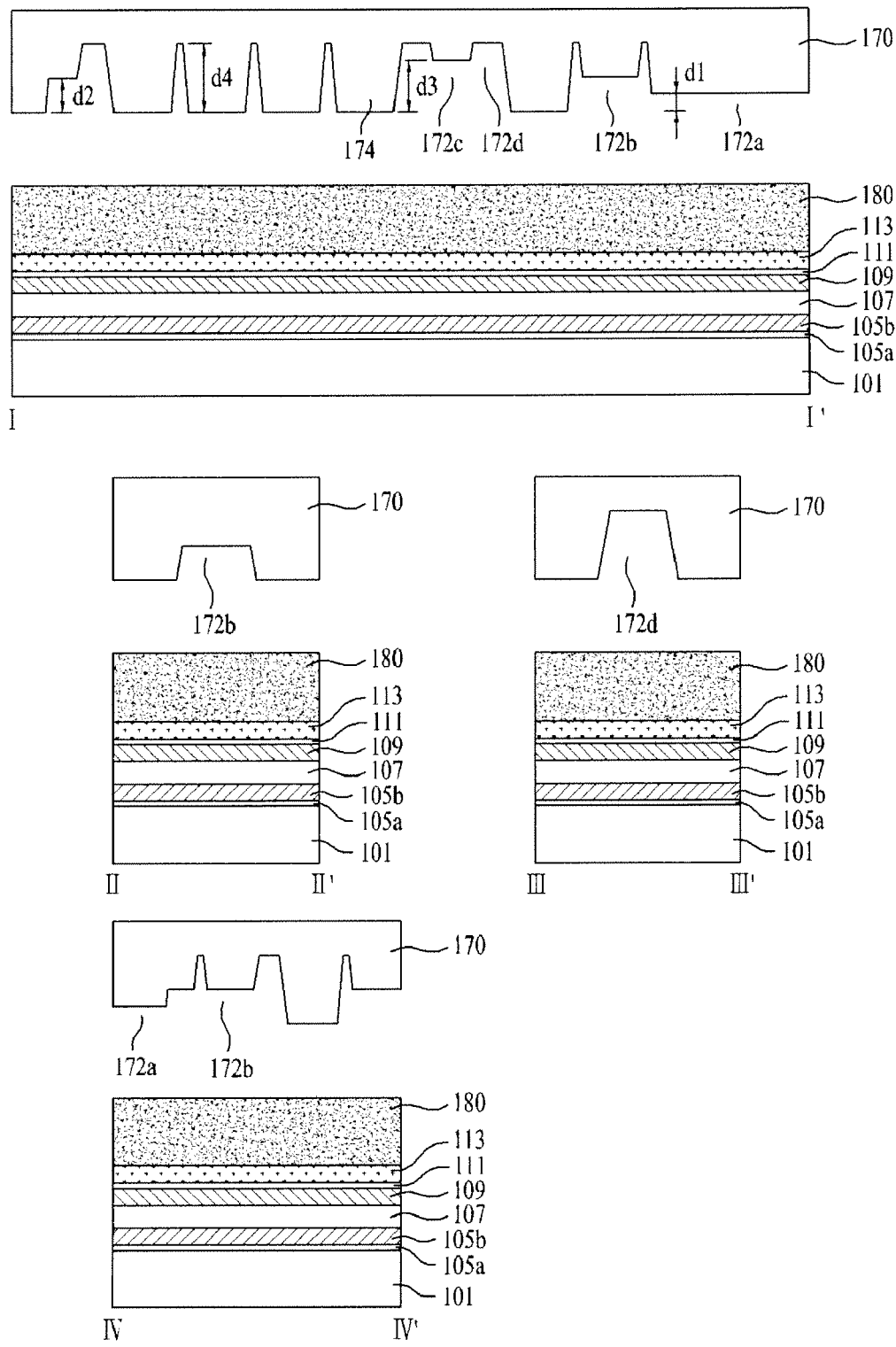
FIGS. 7A to 7H show sectional views describing the first patterning process shown in FIGS. 5 and 6, in detail.

In detail, referring to FIG. 7A, a transparent conductive layer 105a, a gate metal layer 105b, a gate insulating film 107, an amorphous silicon layer 109, an impurity $n^+$ or $p^+$ doped amorphous silicon layer 111 and source/drain metal layer 113 are formed on the lower substrate 101 in succession. The transparent conductive layer 105a may be formed of indium tin oxide ITO, indium tin zinc oxide ITZO, tin oxide TO, indium zinc oxide IZO, or $SnO_2$, the gate insulating film 107 may be formed of an inorganic insulating material, such as oxide silicon SiOx or nitride silicon SiNx, and the gate metal layer 105b and the source/drain metal layer 113 may be formed of Al, Cr, Ti, Ta, Mo, MoW, Al/Cr, Cu, Al(Nd), Al/Mo, Al(Nd)/Al, Al(Nd)/Cr, Mo/Al(Nd)/Mo, Cu/Mo or Ti/Al(Nd)/Ti.

After coating an etch-resist 180 on the source/drain metal layer 113, a soft mold 170 having first to fourth grooves 172a, 172b, 172c, 172d and a projection 174 is then aligned with the lower substrate 101. The first groove 172a of the soft mold 170 has a first depth d1 and faces a region where the pixel electrode 112 is to be formed thereon. The second groove 172b of the soft mold 170 has a second depth d2 deeper than the first groove d1 and faces a region where the first conductive pattern group including the gate line 102, the gate electrode 106 and the gate pad lower electrode, and the drain contact hole 120 and the storage contact hole 144 are to be formed thereon. The third groove 172c of the soft mold 170 has a third depth d3 deeper than the second groove d2 and faces a region where the channel region of the thin film transistor 130 is to be formed thereon. The fourth groove 172d of the soft mold 170 faces a region where the second conductive pattern group including the data line 104, the source electrode 108, the drain electrode 110, the data pad lower electrode 162 and the storage electrode 142 is to be formed thereon. The projection 174 of the soft mold 170 faces the first to fourth slits 128, 138, 158, 148 and the pixel region.

Figure 7B:
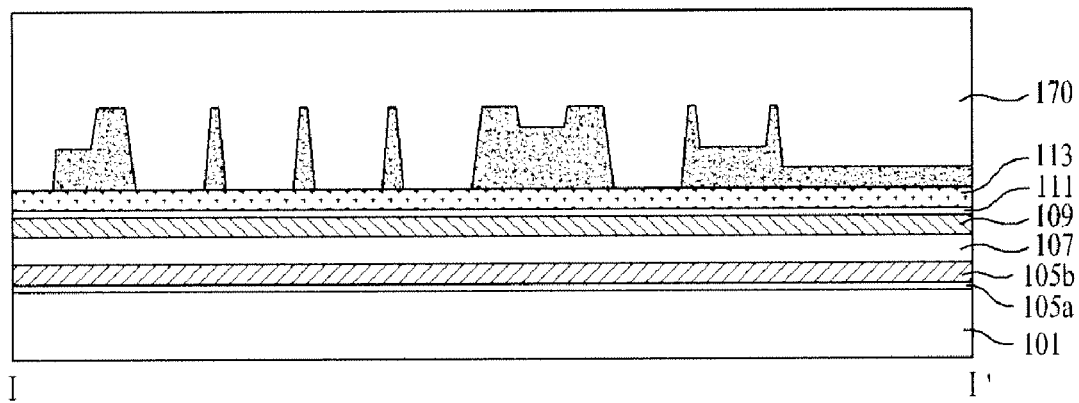
Figure 7B:
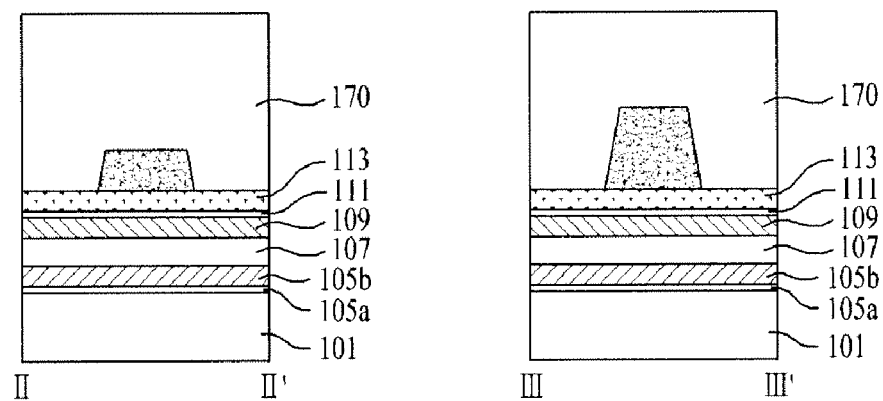
Figure 7B:
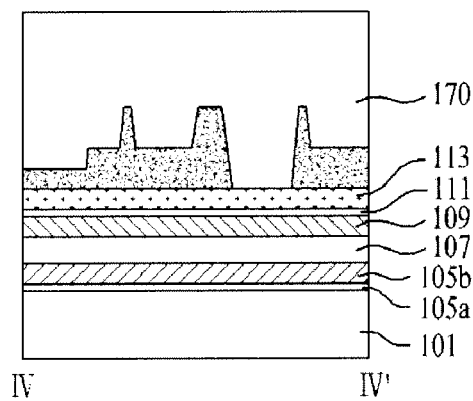
Figure 7C:
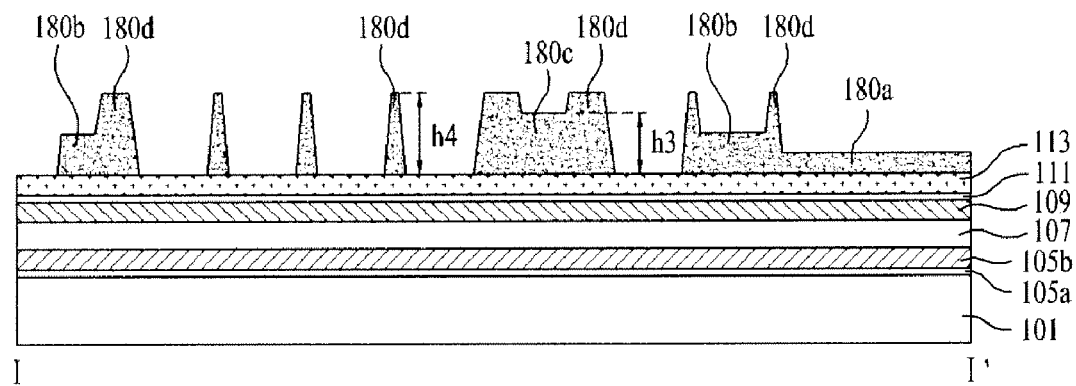
Figure 7C:
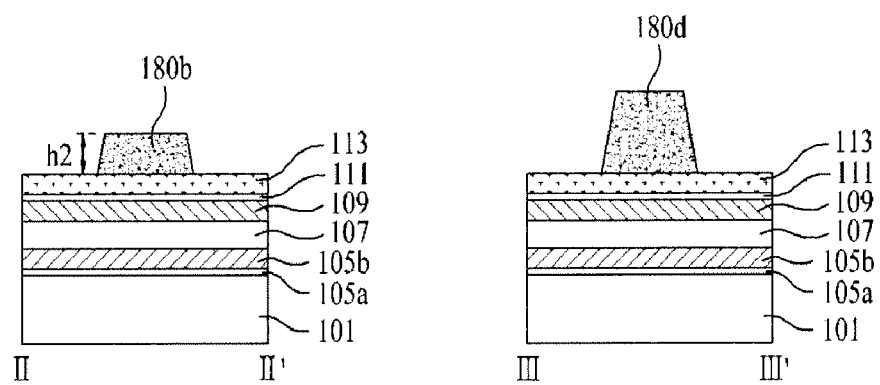
Figure 7C:
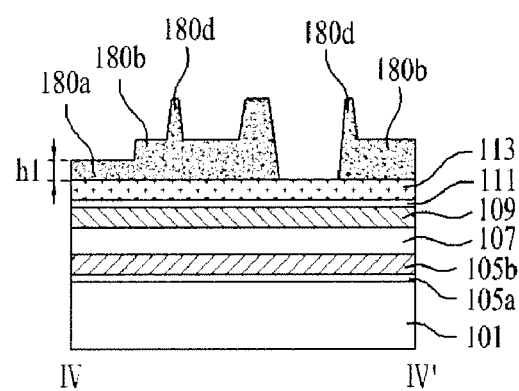

The soft mold 170 may be formed of a rubber having a high elasticity, such as PDMS (Poly dimethyl siloxane). The soft mold 170 is pressed down to the etch-resist 180 for a predetermined time period such that a surface of the projection 174 maintains a contact with an upper surface of the lower substrate 101 with a weight in a range of the gravity of the soft mold 170. The projection 174 of the soft mold 170 is pressed down until the projection 174 is brought into contact with the source/drain metal layer 113. Then, as shown in FIG. 7B, because of a pressure between the soft mold 170 and the lower substrate 101, a capillary force caused by a surface tension and a repelling force between the soft mold 170 and the etch resist 180, a portion of the etch-resist 180 moves into the grooves 172a, 172b, 172c, 172d in the soft mold 170. As shown in FIG. 7C, the soft mold 170 is then removed, leaving first to fourth resist patterns 180a, 180b, 180c, 180d in shapes of inverted transcription of the first to fourth grooves 172a, 172b, 172c, 172d, respectively. The first resist pattern 180a has a first height h1 corresponding to the first depth d1 of the first groove 172a of the soft mold 170, the second resist pattern 180b has a second height h2 (h2>h1) corresponding to the second depth d2 of the second groove 172b of the soft mold 170, the third resist pattern 180c has a third height h3 (h3>h2) corresponding to the third depth d3 of the third groove 172c of the soft mold 170, and the fourth resist pattern 180d has a fourth height h4 (h4>h3) corresponding to the fourth depth d4 of the fourth groove 172d of the soft mold 170.

The etch-resist remained on regions except the first to fourth resist patterns 180a, 180b, 180c, 180d as a residual film may then be removed by an ashing process.

Figure 7D:
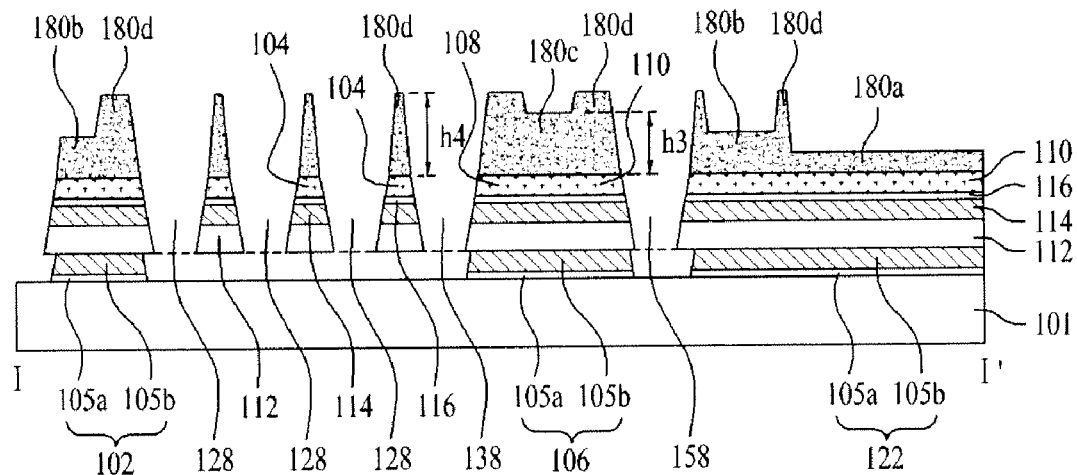
Figure 7D:
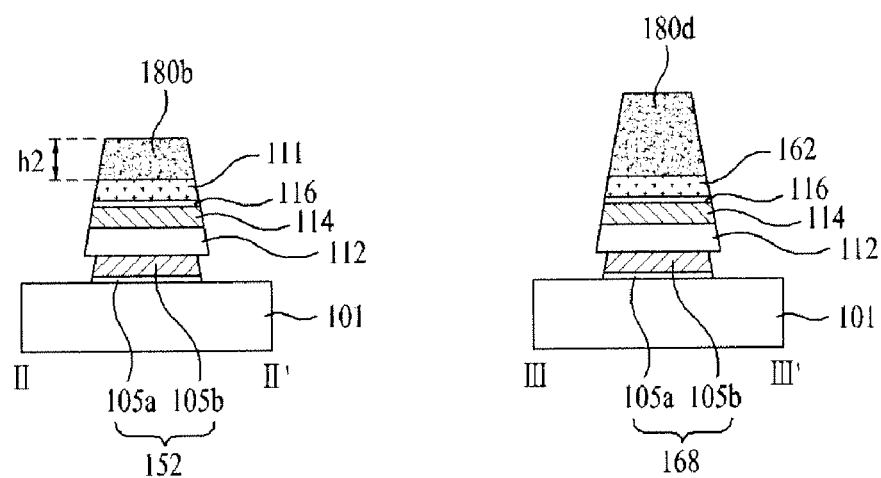
Figure 7D:
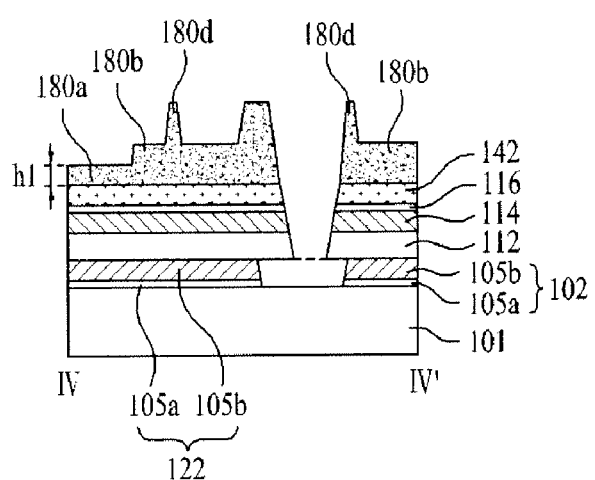

Referring to FIG. 7D, the source/drain metal layer 113 is then wet etched by using the first to fourth resist patterns 180a, 180b, 180c, 180d as a mask to form the second conductive pattern group including the data line 104 having a plurality of the first slits 128, the source electrode 108 having the second slits 138, the drain electrode 110 having the third slits 158 positioned at the pixel region, the storage electrode 142 having the fourth slits 148, and the data pad lower electrode 162. Then, a dry etching is performed by using the impurity $n^+$ or $p^+$ doped amorphous silicon layer 111, the amorphous silicon layer 109, the gate insulating film 107 under the first to fourth resist patterns 180a, 180b, 180c, 180d as a mask to form the active layer 114, the ohmic contact layer 116 and the gate insulating pattern 112 having the same patterns. Then, the gate metal layer 105b and the transparent conductive layer 105a are wet etched by using the first to fourth resist patterns 180a, 180b, 180c, 180d as a mask. In this instance, the transparent conductive layer 105a and the gate metal layer 105b are over-etched such that a line width is smaller than that of the gate insulating pattern 112. As a result, the first conductive pattern having a double-layered structure is formed, which includes the gate metal pattern 168, the gate line 102, the gate electrode 106, the gate pad lower electrode 152 and the pixel electrode 122.

The first to fourth slits 128, 138, 158, 148 are used as an introduction passage of an etch solution or an etch gas during the etching processes of the source/drain metal layer 113, the impurity $n^+$ or $p^+$ doped amorphous silicon layer 111, the amorphous silicon layer 109, the gate insulating film 107, the gate metal layer 105b and the transparent conductive layer 105a. The impurity $n^+$ or $p^+$ doped amorphous silicon layer 111, the amorphous silicon layer 109, the gate insulating film 107, the gate metal layer 105b and the transparent conductive layer 105a that are exposed through the first to fourth slits 128, 138, 158, 148 are removed at the time of etching the respective thin film layers. The over-etching of the gate metal layer 105b and the transparent conductive layer 105a facilitates removing the gate metal layer 105b and the transparent conductive layer 105a positioned under the source/drain metal layer between the first to fourth slits 128, 138, 158, 148. As a result, disconnections are made between the gate line 102 and the gate metal pattern 168, between the gate electrode 106 and the gate metal pattern 168, between the gate electrode 106 and the pixel electrode 122, and between the gate line 102 and the pixel electrode 122.

Figure 7E:
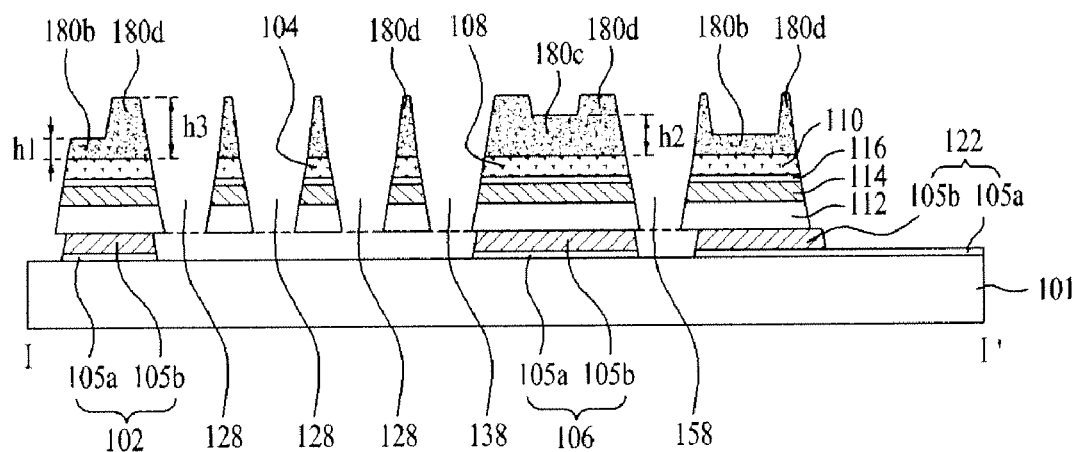
Figure 7E:
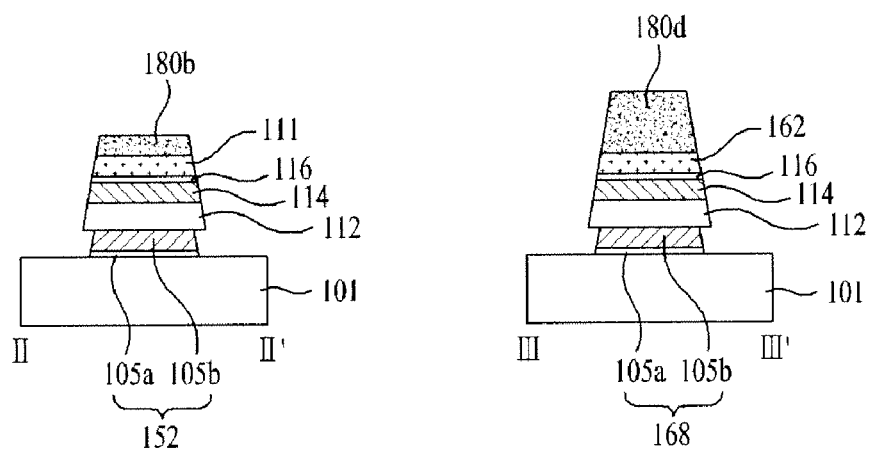
Figure 7E:
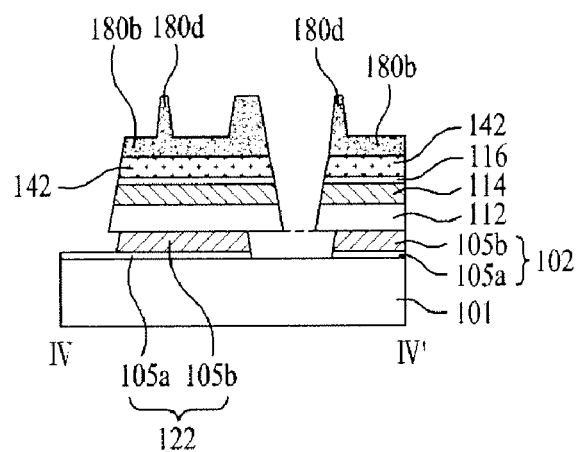

Referring to FIG. 7E, the first to fourth resist patterns 180a, 180b, 180c, 180d are then ashed with an oxygen $O_2$ plasma to remove the first resist pattern 180a from the region where the pixel electrode 122 is to be formed and to make the second to fourth resist patterns 180b, 180c, 180d thinner. By using the second to fourth resist patterns 180b, 180c, 180d as a mask, the drain electrode 110 at the pixel region is then wet etched, the active layer 114, the ohmic contact layer 116 and the gate insulating pattern 112 are dry etched, and the gate metal layer 105b on the pixel electrode 122 is wet etched to expose the transparent conductive layer 105a of the pixel electrode 122.

Figure 7F:
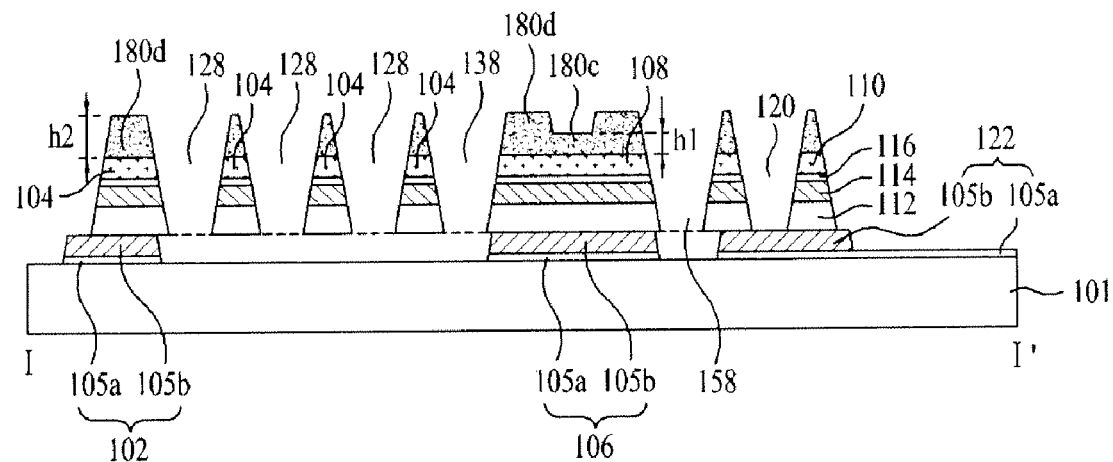
Figure 7F:
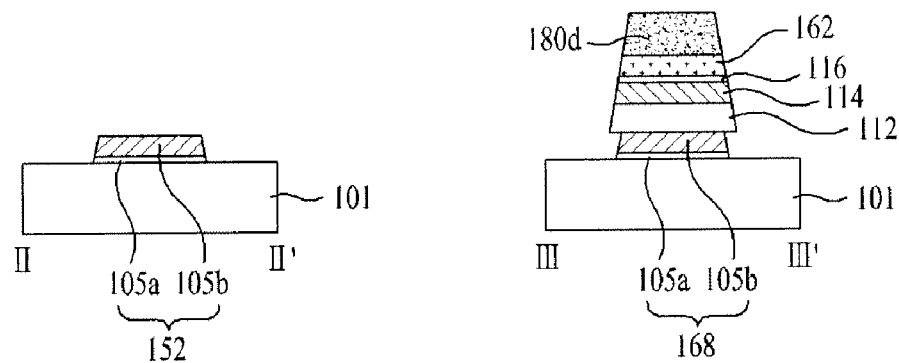
Figure 7F:
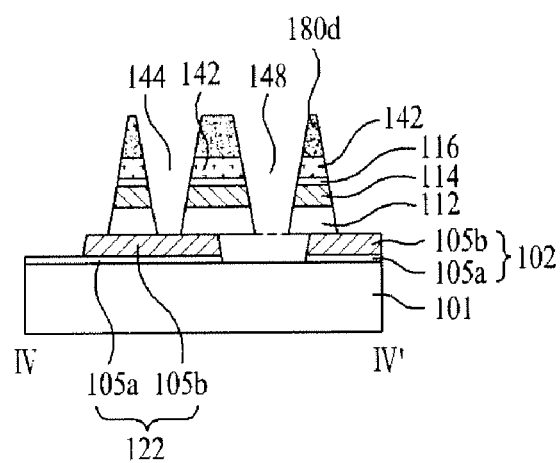

Referring to FIG. 7F, the second to fourth resist patterns 180b, 180c, 180d are then ashed by using an oxygen plasma $O_2$ to remove the second resist pattern 180b and to make the third to fourth resist patterns 180c, 180d thinner. By using the third to fourth resist patterns 180c, 180d as a mask, the drain electrode 110 and the storage electrode 142, which are exposed as the second resist pattern is removed, are then wet etched, and the active layer 114, the ohmic contact layer 116 and the gate insulating pattern 112 are dry etched. As a result, the gate line 102 and the gate pad lower electrode 152 are exposed and the drain contact hole 120 and the storage contact hole 144 are formed.

Figure 7G:
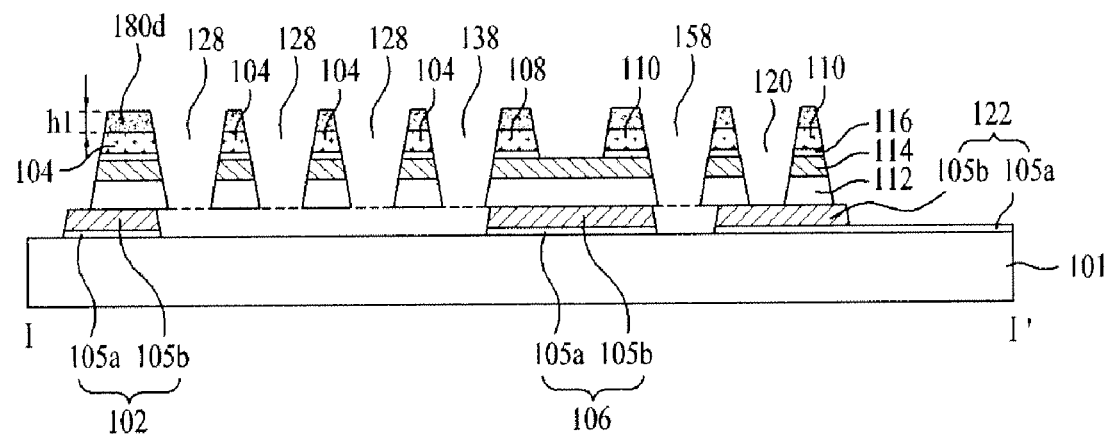
Figure 7G:
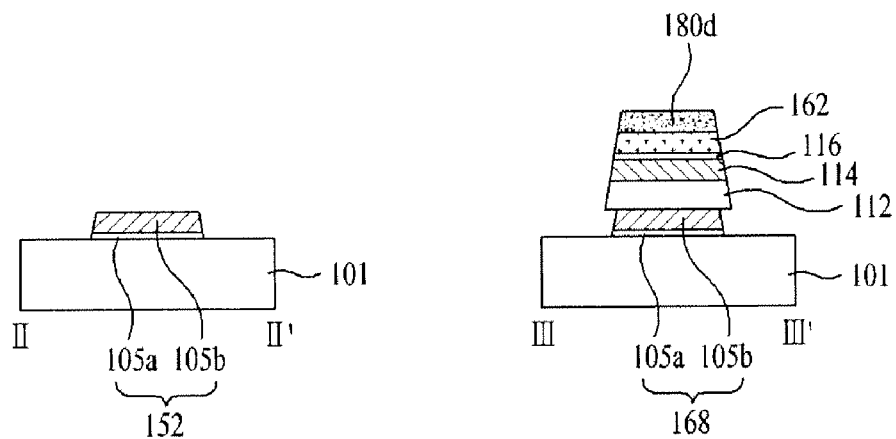
Figure 7G:
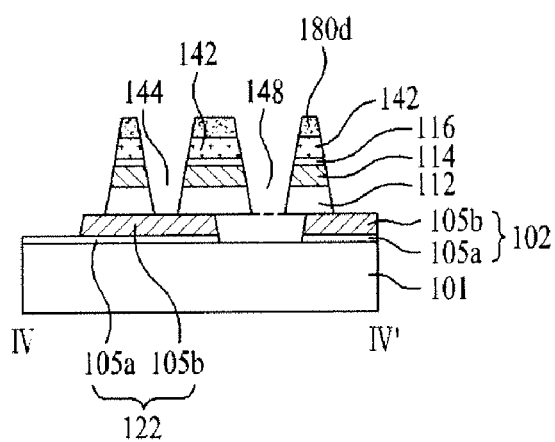
Figure 7H:
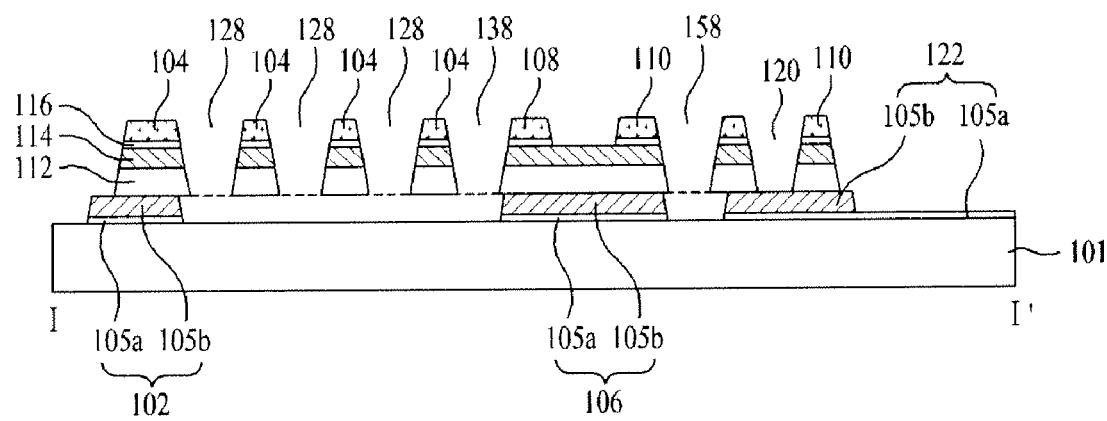
Figure 7H:
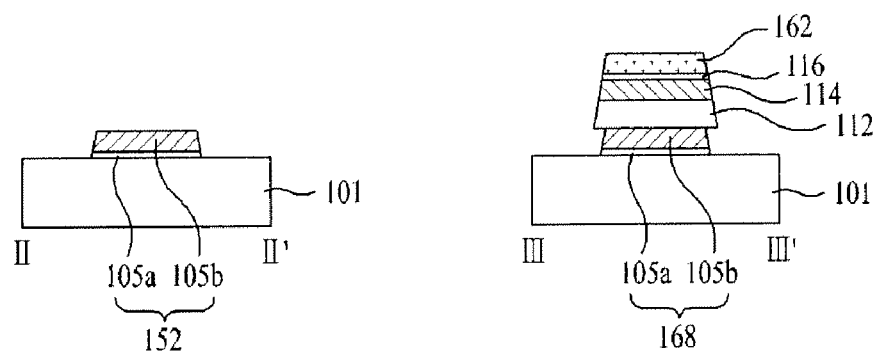
Figure 7H:
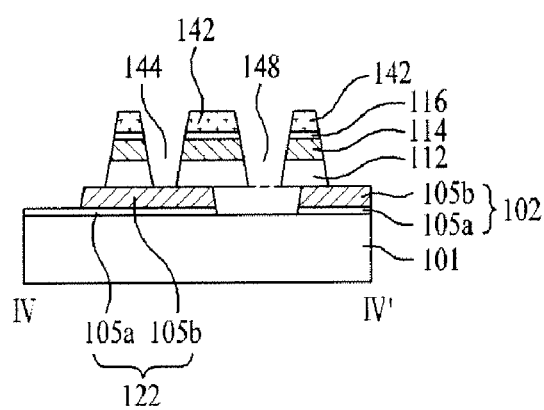

Referring to FIG. 7G, the third to fourth resist patterns 180c, 180d are then ashed by using an oxygen plasma $O_2$ to remove the third resist pattern 180c from a region where the channel region of the thin film transistor is to be formed and to make the fourth resist pattern 180d thinner. By using the fourth resist pattern 180d as a mask, the source/drain metal layer, which is exposed as the third resist pattern 180c is remove, is then wet etched and the ohmic contact layer 116 is dry etched. As a result, a channel constructed of the active layer 114 is formed between the source electrode 108 and the drain electrode 110. The fourth resist pattern 180d is then stripped from an upper side of the second conductive pattern group, as shown in FIG. 7H.

As described above, the first and second conductive pattern groups, the semiconductor pattern and the pixel electrode are formed by a first patterning process using an etch-resist and a soft mold. However, a thin film transistor substrate according to the present invention can be fabricated by a single patterning process using a photo-resist pattern having the first to fourth heights formed by a photo mask.

Figure 8:
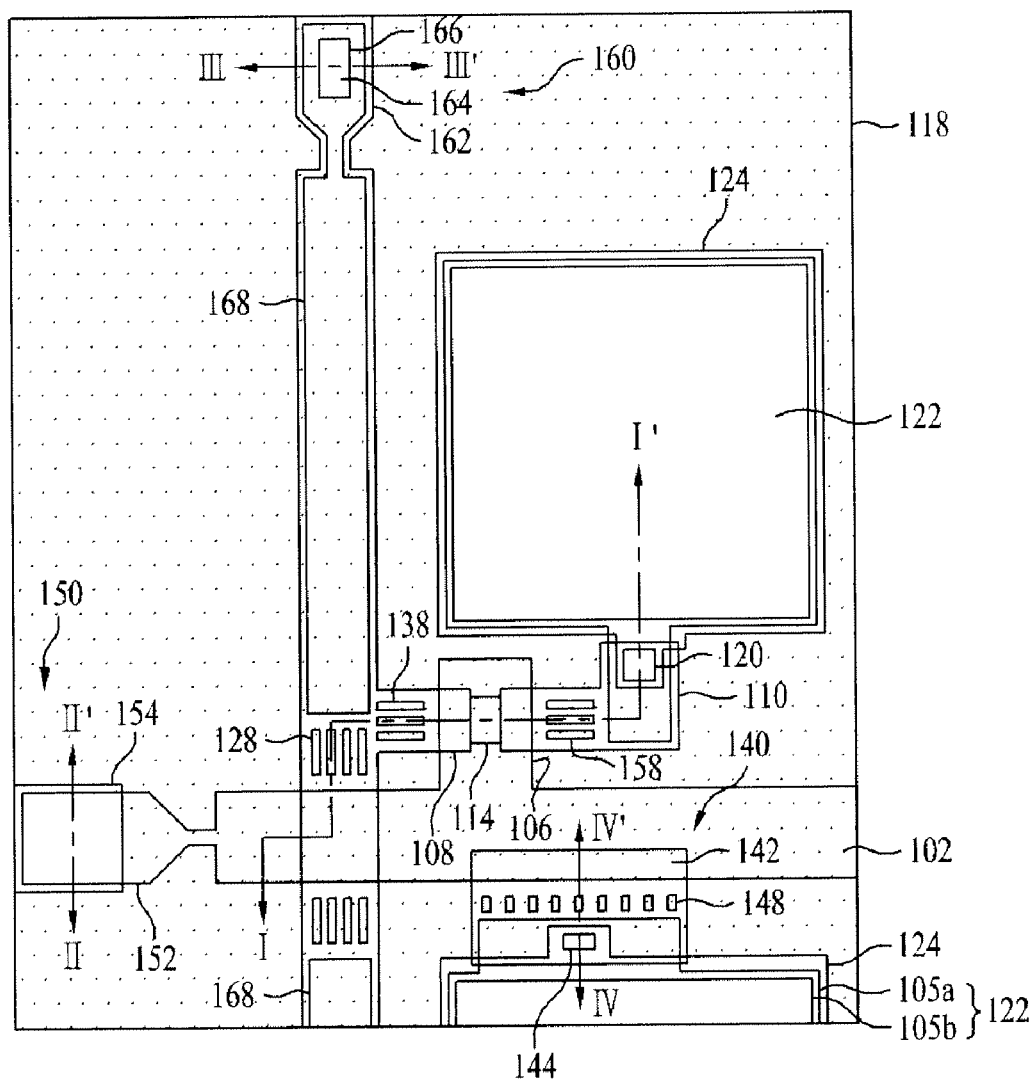
FIG. 8 shows a plan view illustrating a second patterning process for fabricating a thin film transistor substrate of the present invention.
Figure 9:
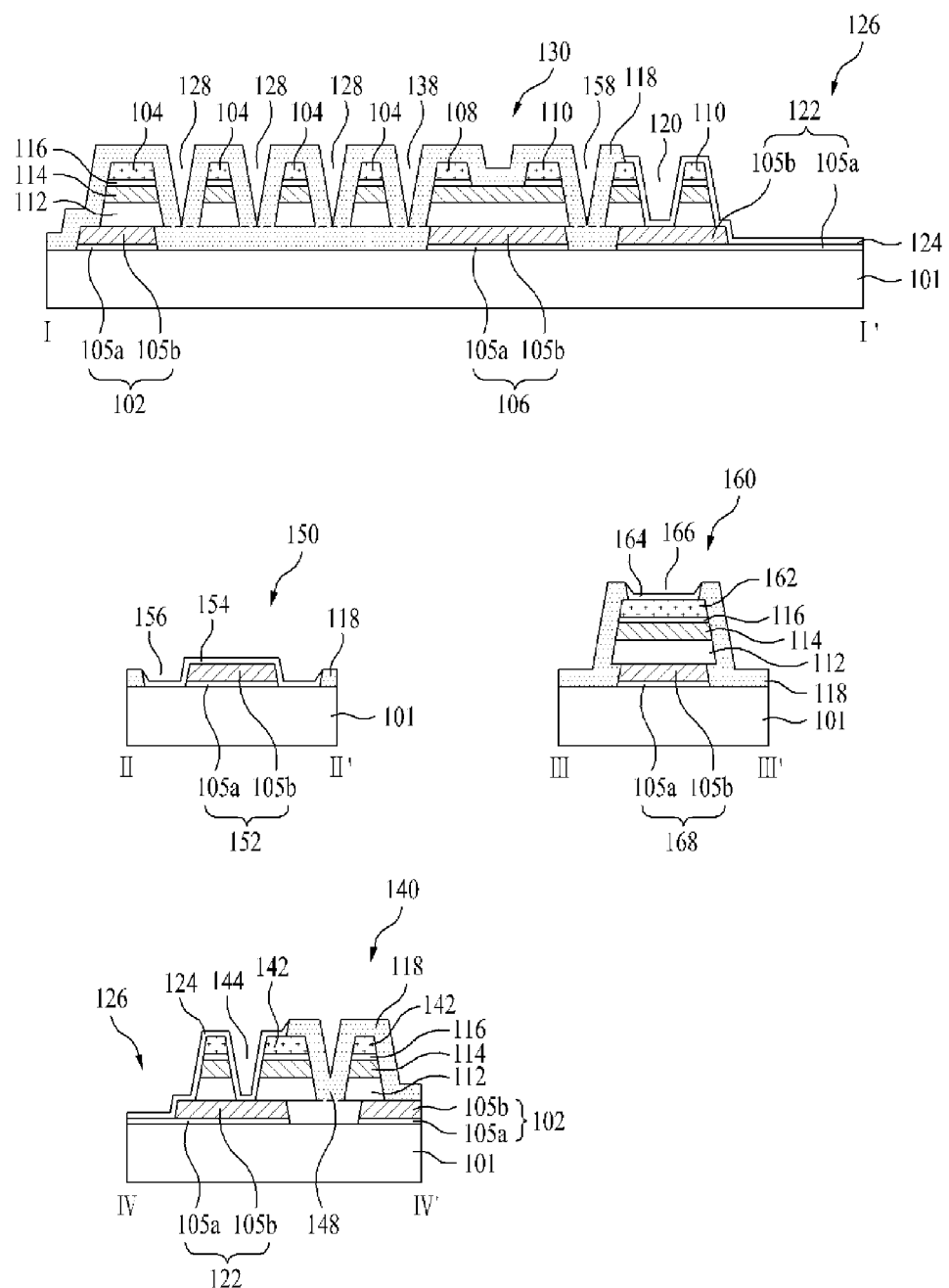
FIG. 9 shows a sectional view illustrating a second patterning process for fabricating a thin film transistor substrate of the present invention.

FIGS. 8 and 9 show a plan view and a sectional view illustrating a second patterning process for fabricating a thin film transistor substrate of the present invention.

Referring to FIGS. 8 and 9, a protective film 118 having a gate contact hole 156, a data contact hole 166, and a pixel hole 126 and a third conductive pattern group having a connection electrode 124, a gate pad upper electrode 154 and a data pad upper electrode 164 are formed on the lower substrate 101 having the second conductive pattern group formed thereon by the first patterning process. The third conductive pattern group forms a boundary with the protective film 118 without overlapping the protective film 118. This will be described in detail with reference to FIGS. 10A to 10C.

Figure 10A:
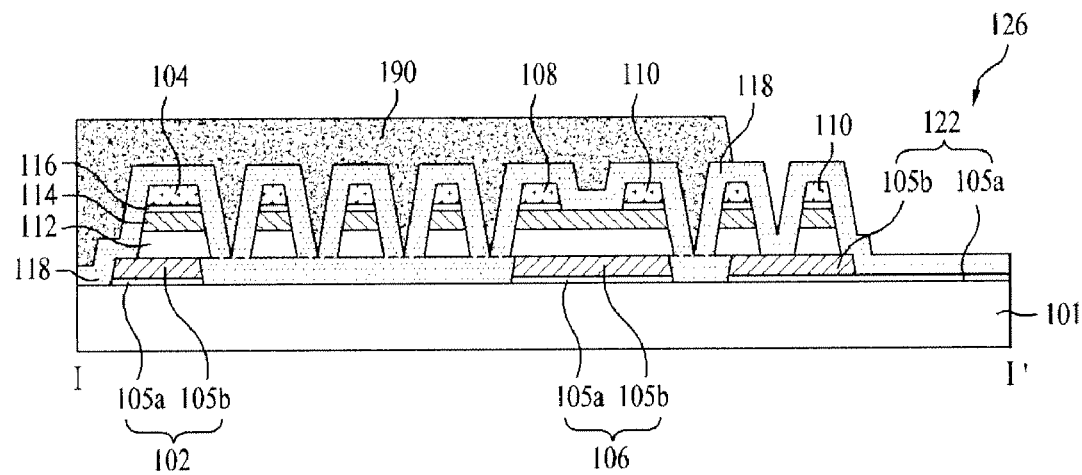
FIGS. 10A to 10D show sectional views describing the second patterning process shown in FIGS. 8 and 9, in detail.
Figure 10A:
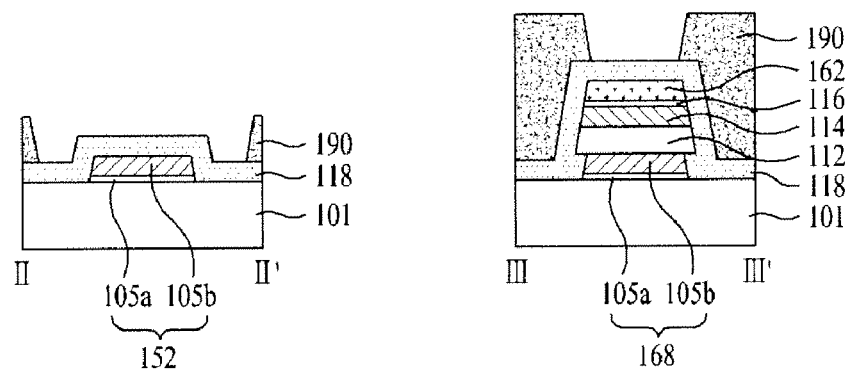
Figure 10A:
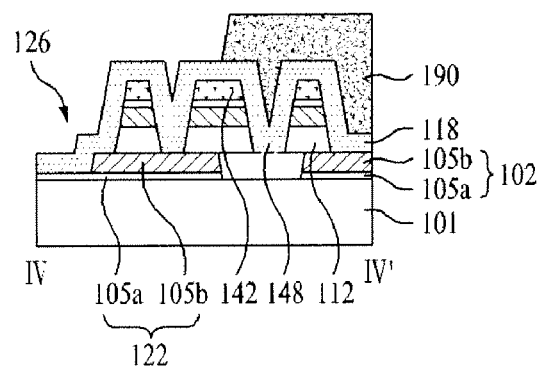
Figure 10B:
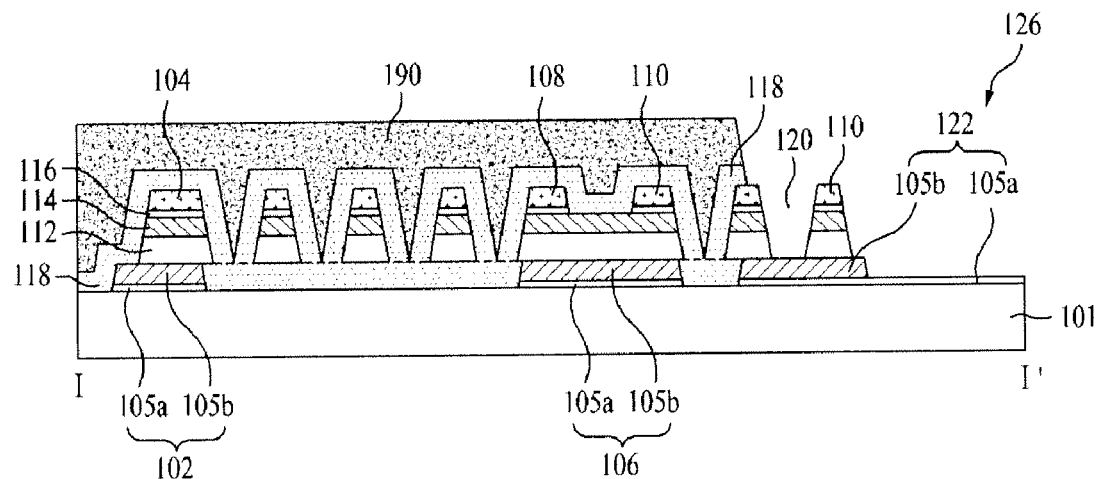
Figure 10B:
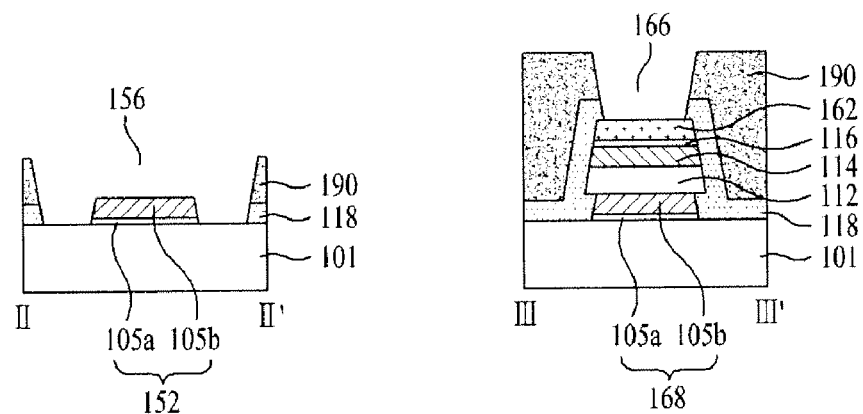
Figure 10B:
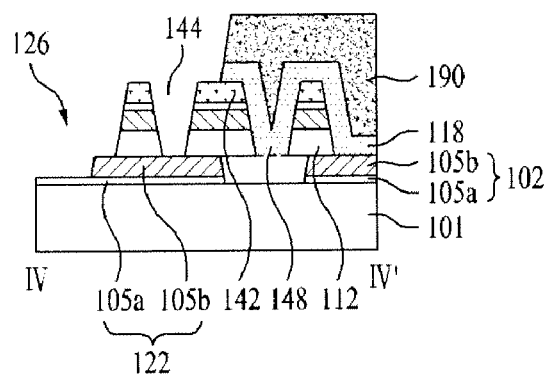

Referring to FIG. 10A, the protective film 118 is formed on the lower substrate 101 having the second conductive pattern group formed thereon by the first patterning process. The protective film 118 may be formed of an inorganic material similar to the gate insulating pattern 112, or an organic insulating material. Then, a photoresist pattern 190 is formed at a region where the protective film 118 is to be formed thereon by a photolithography process. The protective film 118 is then etched by using the photoresist pattern 190 as a mask to form the gate contact hole 156, the data contact hole 166, and the pixel hole 126 as shown in FIG. 10B. The pixel hole 126, which passes through the protective film 118, exposes the pixel electrode 122. The drain contact hole 120, the storage contact hole 144 and the gate contact hole 156, which pass through the protective film 118, expose the gate pad lower electrode 152. The data contact hole 166, which passes through the protective film 118, exposes the data pad lower electrode 162.

Figure 10C:
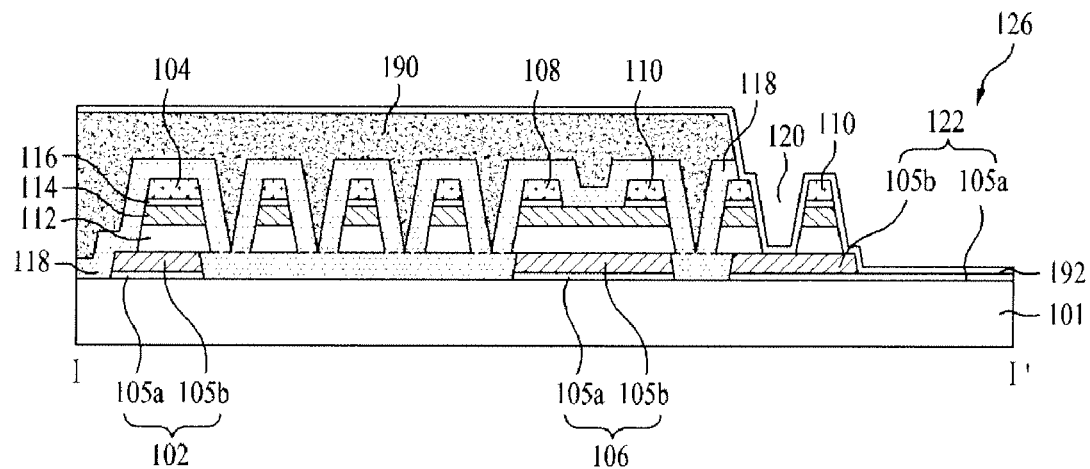
Figure 10C:
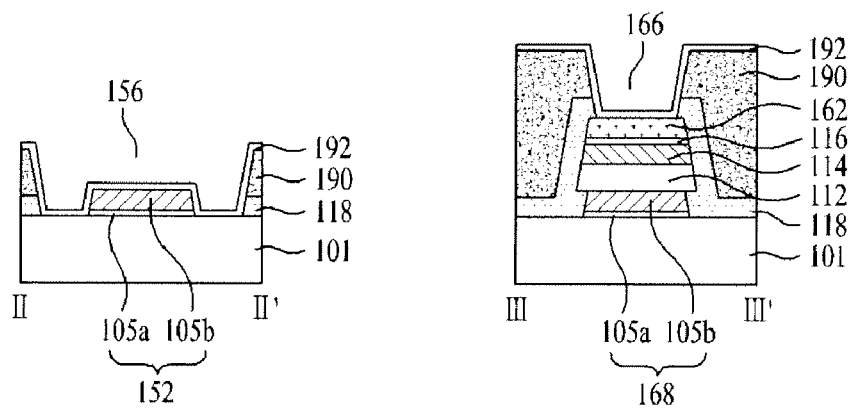
Figure 10C:
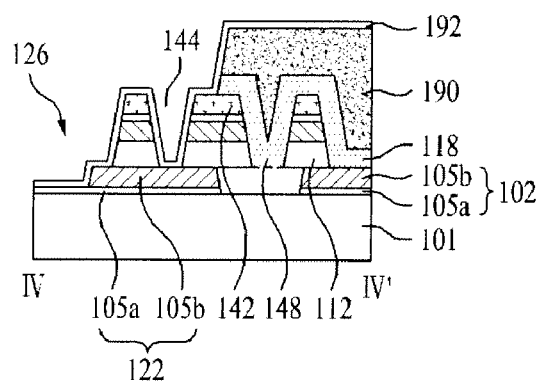
Figure 10D:
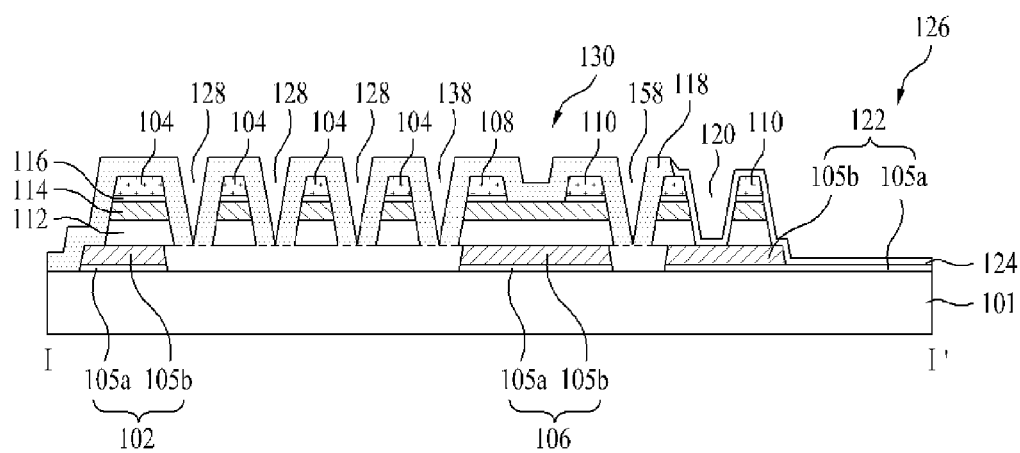
Figure 10D:
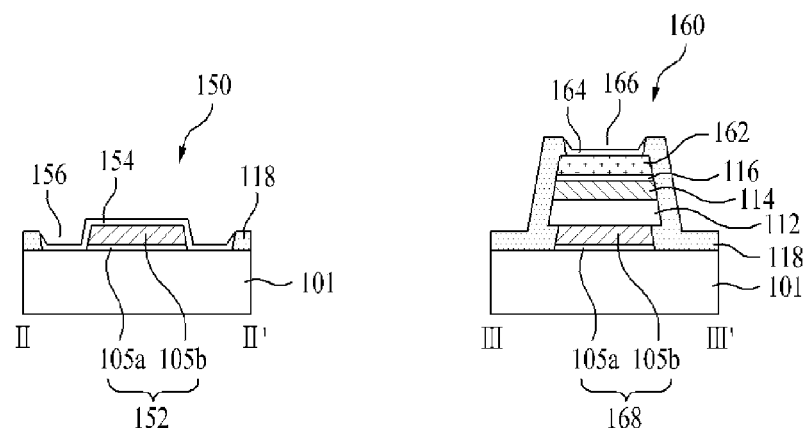
Figure 10D:
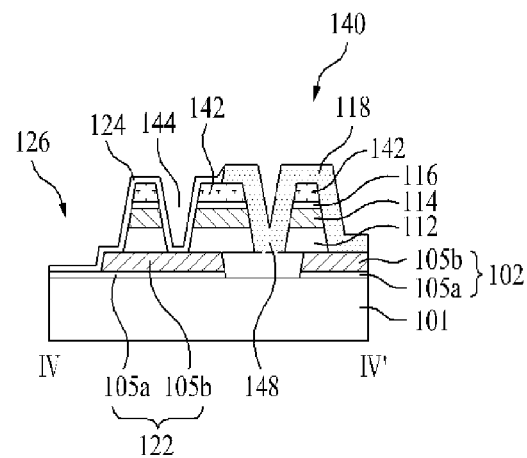

Referring to FIG. 10C, a transparent conductive layer 192 is formed on an entire surface of the lower substrate 101 having the photoresist pattern 190 remained thereon by a deposition process such as sputtering. The transparent conductive layer 192 may be formed of indium tin oxide ITO, indium tin zinc oxide ITZO, tin oxide TO, indium zinc oxide IZO, or $SnO_2$. The photoresist pattern 190 and the overlying transparent conductive layer 192 are removed together by a lift-off process to pattern the transparent conductive layer 192. As a result, the third conductive pattern group having the connection electrode 124, the gate pad upper electrode 154 and the data pad upper electrode 164 is formed. The third conductive pattern group forms a boundary with the protective film 118 without an overlap with the protective film 118.

In detail, the connection electrode 124 forms a boundary with the protective film 118 near the pixel hole 126, is connected to the drain electrode 110 and the gate metal layer 105b of the pixel electrode 122 through the drain contact hole 120, and is directly connected to the transparent conductive layer 105a of the pixel electrode 122. The gate pad upper electrode 154 forms a boundary with the protective film 118 near the gate contact hole 156 and is connected to the gate pad lower electrode 152. The data pad upper electrode 164 forms a boundary with the protective film 118 near the data contact hole 166, and is connected to the data pad lower electrode 162.

A thin film transistor substrate and method for fabricating the same according to the present invention has the following advantages. The first conductive pattern group including the gate line, the pixel electrode and the second conductive pattern group including the data line are formed by a single patterning process. As a result, a thin film transistor substrate and method for fabricating the same of the present invention reduces the number of fabrication steps and thus save the production costs. Also, because the number of alignment steps required for forming the first conductive pattern group, the pixel electrode and the second conductive pattern group is reduced, defects caused by misalignments can be minimized or prevented.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A method for fabricating a thin film transistor substrate comprising:
    forming a first conductive pattern group, a gate insulating patterns, a semiconductor pattern, a second conductive pattern group, and a plurality of first slits on a substrate by a first patterning process, wherein the first conductive pattern group includes a pixel electrode, a gate line, a gate metal pattern and a gate electrode of a thin film transistor, and the second conductive pattern group includes a data line, a source electrode and a drain electrode of the thin film transistor, and forming a connection electrode connecting the drain electrode to the pixel electrode by a second patterning process, wherein the gate metal pattern is disconnected from the gate line with the plurality of the first slits disposed therebetween.

2. The method as claimed in claim 1, wherein the first patterning process further includes forming a plurality of second slits in the source electrode to disconnect the gate metal pattern from the gate electrode.

3. The method as claimed in claim 2, wherein the first patterning process further includes forming a plurality of third slits in the drain electrode to disconnect the pixel electrode from the gate electrode.

4. The method as claimed in claim 3, wherein the first patterning process further includes forming a plurality of fourth slits in a storage capacitor electrode partially overlapping the gate line to disconnect the pixel electrode from the gate line.

5. The method as claimed in claim 1, wherein the first patterning process further includes:

forming a first transparent conductive layer, a gate metal layer, a gate insulating film, an amorphous silicon layer, an impurity doped amorphous silicon layer, and a source/drain metal layer on the substrate in succession, forming first to fourth resist patterns on the source/drain metal layer by using a soft mold, wherein the first resist pattern has a first height, the second resist pattern having a second height higher than the first height, the third resist pattern has a third height higher than the second height, and the fourth resist pattern has a fourth height higher than the third height, first etching the source/drain metal layer, the impurity doped amorphous silicon layer, the amorphous silicon layer, the gate insulating film, the gate metal layer, and the first transparent conductive layer in succession by using the first to fourth resist patterns, wherein the first to fourth resist patterns are used as a first mask during the first etching, ashing the first to fourth resist patterns to remove the first resist pattern and to make the second to fourth resist patterns lower, second etching the source/drain metal layer, the impurity doped amorphous silicon layer, the amorphous silicon layer, the gate insulating film, the gate metal layer, and the first transparent conductive layer in succession by using the second to fourth resist patterns, wherein the second to fourth resist patterns are used as a second mask during the second etching, ashing the second to fourth resist-patterns to remove the second resist pattern and to make the third and fourth resist patterns lower, third etching the source/drain metal layer, the impurity doped amorphous silicon layer, the amorphous silicon layer, the gate insulating film at a pixel region in succession by using the third and fourth resist patterns, wherein the third and fourth resist patterns are used as a third mask during the third etching, ashing the third and fourth resist patterns to remove the third resist pattern and to make the fourth resist pattern lower, fourth etching the source/drain metal layer, and the impurity doped amorphous silicon layer between the source and drain electrodes in succession by using the fourth resist pattern, wherein the fourth resist pattern is used as a fourth mask during the fourth etching, and stripping the fourth resist pattern to remove the fourth resist pattern.

6. The method as claimed in claim 5, wherein the second patterning process further includes:

forming a protective film on an entire surface of the substrate to cover the first and the second conductive pattern groups, forming a photoresist pattern on the protective film, etching the protective film by using the photoresist pattern as a fifth mask to form a drain contact hole, a gate contact hole, and a data contact hole, forming a second transparent conductive layer on the entire surface of the substrate to cover the photoresist pattern, and patterning the second transparent conductive layer by removing the photoresist pattern and the second transparent conductive layer on the photoresist pattern by using a lift off process, to form the connection electrode, wherein the connection electrode is formed to have a boundary with the protective film.

7. The method as claimed in claim 6, wherein the gate line and the gate electrode of the thin film transistor are formed with at least two layers including the first transparent conductive layer and the gate metal layer.

8. The method as claimed in claim 7, wherein the pixel electrode is formed with at least two layers including the first transparent conductive layer and the gate metal layer, and wherein the first transparent conductive layer of the pixel electrode is surrounded by the gate metal layer, and wherein the pixel electrode is connected to the connection electrode through the drain contact hole.

9. The method as claimed in claim 6, further comprising: forming a gate pad extended from the gate line and having a gate pad lower electrode and a gate pad upper electrode, the gate pad lower electrode formed by the first patterning process and the gate pad upper electrode formed of the second transparent conductive layer by the second patterning process, wherein the gate pad upper electrode is connected to the gate pad lower electrode through the gate contact hole.

10. The method as claimed in claim 6, further comprising: forming a data pad extended from the data line and having a data pad lower electrode and a data pad upper electrode, the data pad lower electrode formed of the source/drain metal layer by the first patterning process and the data pad upper electrode formed of the second transparent conductive layer by the second patterning process, wherein the data pad upper electrode is connected to the data pad lower electrode through the data contact hole.

11. The method as claimed in claim 10, further comprising: forming an active layer and an ohmic contact layer, wherein the gate metal pattern, the gate insulating pattern, the active layer and the ohmic contact layer are between the data pad lower electrode and the substrate, and wherein the semiconductor pattern includes the active layer formed of the amorphous silicon layer, and the ohmic contact layer formed of the impurity doped amorphous silicon layer.

* * * * *